United States Patent [19]

Picquendar

[11] 4,309,678
[45] Jan. 5, 1982

[54] SAMPLING FILTER

[75] Inventor: Jean-Edgar Picquendar, Paris, France

[73] Assignee: Thomson-CSF, Paris, France

[21] Appl. No.: 117,021

[22] Filed: Jan. 30, 1980

[30] Foreign Application Priority Data

Feb. 2, 1979 [FR] France .................................. 79 02765

[51] Int. Cl.³ ...................... H03H 17/06; G11C 27/02; H03K 5/156
[52] U.S. Cl. ................................ 333/165; 307/221 D; 333/173
[58] Field of Search ................. 333/172, 173, 165–166, 333/17 R, 18; 328/167, 151, 127; 357/24; 307/238, 295, 242, 246, 304, 227, 221 R, 221 C, 221 D, 520–523

[56] References Cited

U.S. PATENT DOCUMENTS

| | | | |
|---|---|---|---|
| 3,543,009 | 11/1970 | Voelcker, Jr. | 333/166 X |
| 3,819,958 | 6/1974 | Gosney | 357/24 X |
| 4,052,605 | 10/1977 | Eggermont | 333/165 |
| 4,194,172 | 3/1980 | Picquendar | 333/165 |

*Primary Examiner*—Marvin L. Nussbaum
*Attorney, Agent, or Firm*—Oblon, Fisher, Spivak, McClelland & Maier

[57] ABSTRACT

The invention relates to filters using a charge-transfer device as an active element it consists in providing such a filter with an output circuit of first order interpolator type; this circuit may be external to the charge-transfer device or partially integrated therewith by associating therewith an additional weighting cell and by using another set of weighting coefficients.

3 Claims, 2 Drawing Figures

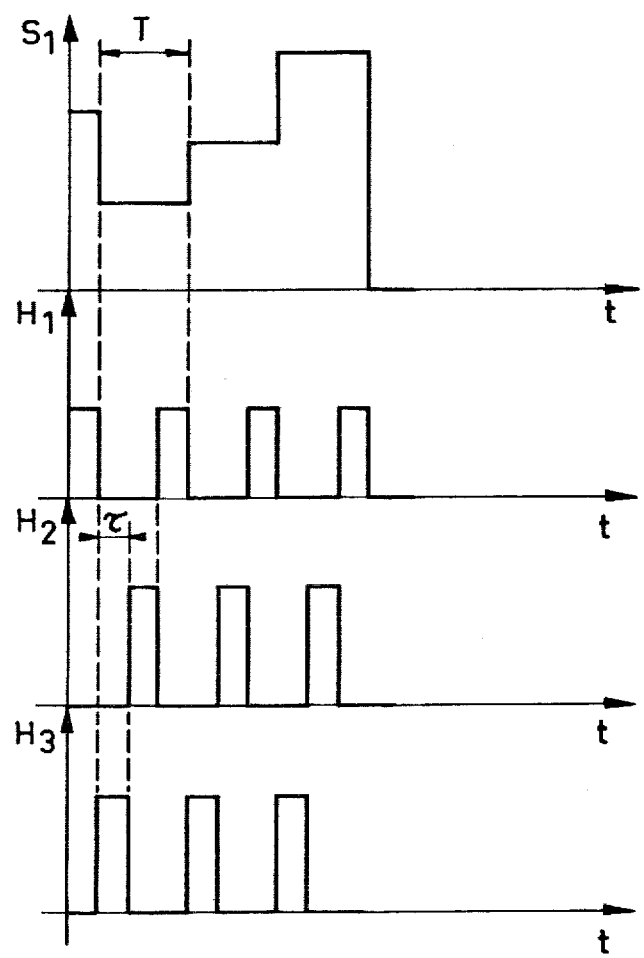

SAMPLING FILTER

BACKGROUND OF THE INVENTION

The present invention relates to sampling filters. These filters are similar to digital filters because they use a sampling process, but they differ therefrom because the samples used are not digitized. This similarity permits the use of methods of synthesis used in the computation of digital filters. Such filters are particularly useful in automatic telephone switches of the temporal type.

The manufacture of such filters is known and a description thereof can be found in the article "Transverse Filtering Using Charge-Transfer Devices" published by Dennis D. BUSS et al. in volume SC8, No. 2, of April 1973 in the review "IEEE Journal of Solid-State Circuits".

The charge-transfer devices used in these filters are also known. We will name them according to the notation CCD in English-language documents. A detailed description thereof will be found in the article "Charge-Coupled Devices" published by Gilbert. F. AMELIO in volume 230, No. 2 February 1974 of the review "Scientific American".

The sampling used disturbs the response curve of the filter and causes a phenomena known for example under the name "spectrum folding" or "ghosts". In order to minimize this phenomena, the filter most often used is a circuit of the "sample hold" type which allows a staircase output signal to be obtained whose spectrum is less extended than that of a signal composed of narrow separate pulses.

It is nevertheless often necessary to complete the action of such a filter by analog filtering more or less depending on the results desired. This is particularly the case in telephony where complementary filter lobe suppressors are used when a very considerable attenuation of the spurious signals outside the band is required.

SUMMARY OF THE INVENTION

The invention aims at reducing to a minimum this analog filtering, or even suppressing it.

In order to accomplish this a device is used which we will call "first order interpolator and which is sometimes known under the name of first order sample and hold circuit" in contrast to the output circuit mentioned above, which is in this case named "zero order sample and hold circuit".

The above and other objects, features and advantages of the present invention will become apparent from the following description, given solely by way of non-limiting illustration, when taken in conjunction with the accompanying drawings.

DESCRIPTION OF THE DRAWINGS

FIG. 2 is a timing diagram of the signals present at different points on the filter.

DESCRIPTION OF THE PREFERRED EMBODIMENTS

Figure 1:
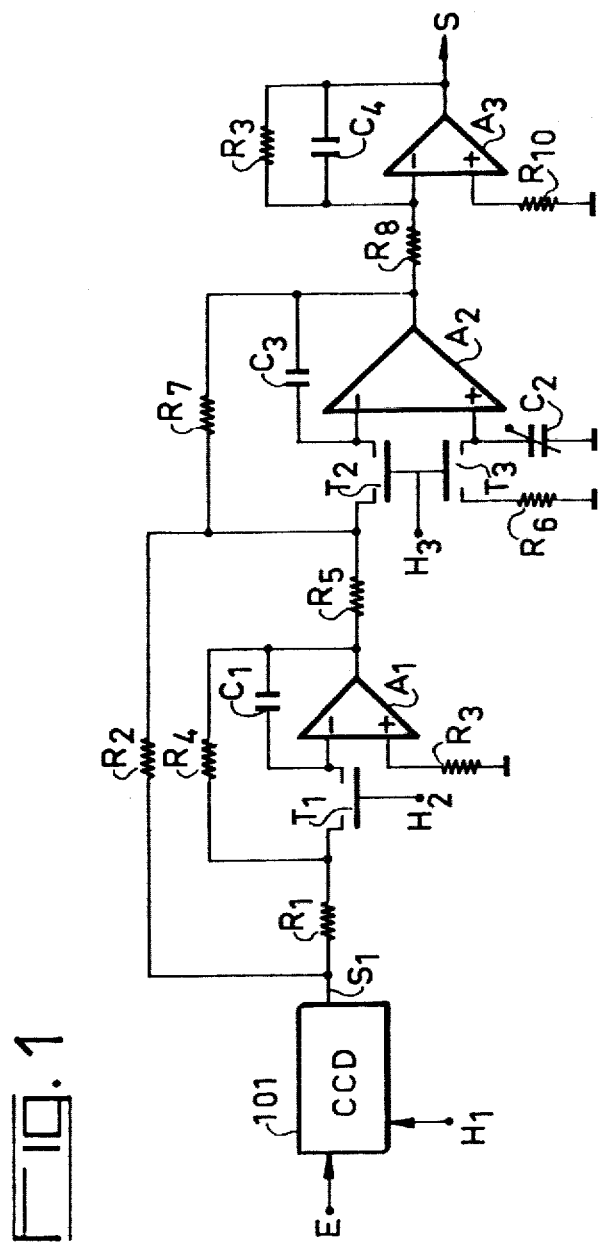
FIG. 1 shows a filter using a charge-transfer device according to the invention.

The filter shown in FIG. 1 comprises a charge-transfer device weighted in a known way to achieve a definite filtering function and provided with subsidiary devices such as a transfer signal generator and a zero order sample and hold. This CCD and its subsidiary circuits are contained in a box 101 which receives the signal to be filtered E and a clock signal $H_1$. The signal thus filtered in a known way and containing spurious signals leaves at output $S_1$ and is applied through a resistor $R_1$ to a first switching transistor $T_1$, of the field-effect type in this embodiment, and through a resistor $R_2$ to a second switching transistor $T_2$.

This signal $S_1$ is shown in FIG. 2 in company with different clock signals used in the filter. It is composed of steps whose beginning is in phase with the trailing edge of the pulses of clock signal $H_1$. This stepped form is characteristic of the output zero order sample and hold circuit of box 101.

To the control electrode of $T_1$ there is applied a clock signal $H_2$ similar to $H_1$ and shown in FIG. 2, but in which the leading edge of the pulses is shifted by a time $\tau$ in relation to the trailing edge of the pulses of $H_1$; the trailing edge of the pulses of $H_2$ coinciding in this example with the leading edge of the pulses of $H_1$ and in any case not having to extend into the transitions between the steps. In this way $T_1$ is momentarily closed for short periods by these pulses, which allows signal $S_1$ to be transmitted to the $-$ input of a first differential amplifier $A_1$ whose $+$ input is connected to ground by means of a resistor $R_3$. This amplifier is coupled with negative feedback by means of a resistor $R_4$ between its output and the input of $T_1$ and a capacitor $C_1$ between this output and its negative input. By giving for example to $C_1$ a value of 200 pF and to $R_4$ and $R_1$ a common value of 4 k$\Omega$, signal $-S_1$ is thus stored in this capacitor with a delay equal to $\tau$. In fact $C_1$ is charged when $T_1$ is closed and remains charged when $T_1$ is open.

The output signal of $A_1$, this representing $-S_1$ with a delay $\tau$ is applied through a resistor $R_5$ to $T_2$ in parallel with $S_1$ which arrives through $R_2$. $T_2$ receives on its control electrode a clock signal $H_3$ shown in FIG. 2, similar to $H_1$ and $H_2$, but whose pulses are inserted between those of $H_1$ and of $H_2$ without overlapping either of them. For the sake of convenience there is shown in the figure the extreme situations where the edges of $H_1$, $H_2$ and $H_3$ coincide, but they can be separated from each other provided the widths of the pulses do not overlap.

When $T_2$ is opened under the influence of $H_3$, the outputs of $R_2$ and $R_5$ are electrically connected to the $-$ input of a second amplifier $A_2$ whose $+$ input is connected to ground through a third switching transistor $T_3$, a resistor $R_6$ and a capacitor $C_2$. $T_3$ receives $H_3$ on its control electrode and serves, with $R_6$ and $C_2$, to compensate for a spurious clock skip due to the sampling. $A_2$ is coupled with negative feedback by means of a resistor $R_7$ between its output and the input of $T_2$ and by means of a capacitor $C_3$ between its output and its negative input. By giving for example to $C_3$ a value of 220 pF, to $R_7$ a value of 8.25 k$\Omega$ and to $R_2$ and $R_5$ a value of 2 k$\Omega$, the signals transmitted by $R_2$ and $R_5$ are added, the result of this addition is multiplied by a factor substantially equal to 4 and the result of these operations is stored in $C_3$. As the signal transmitted by $R_5$ is equal to the signal transmitted by $R_2$ but delayed by a time $\tau$ and since the operation effected by $A_2$ is effected during the time $\tau$ which follows the end of each step of signal $S_1$, there is obtained—except for a multiplication factor and a delay—at the output of $A_2$ a signal representing the difference between the signal $S_1(t)$ and signal $S_1(t-T)$, T representing the period of clock $H_1$.

To obtain a first order interpolator, after obtaining this difference it is necessary to proceed with integration of the signal obtained.

For that the signal at the output of $A_2$ is applied through a resistor $R_8$ to the negative input of an amplifier $A_3$ coupled with negative feedback between its output and this input through a resistor $R_9$ and a capacitor $C_4$. The + input of $A_3$ is connected to ground through a resistor $R_{10}$. By giving to $R_8$ a value of 4.02 k$\Omega$, to $R_9$ a value of 40.2 k$\Omega$, to $C_3$ a value of 133 nF, and to $R_{10}$ a value of 4 k$\Omega$, this stage behaves like an integrator and forms with the preceding stages a first order interpolator which considerably minimizes the out-of-band signals contained in signal $S_1$.

In relation to complementary filtering of the type comprising coils, such a circuit has the advantage of being very easily integratable and delivers at the output S of $A_3$ an output signal whose out-of-band characteristics are particularly good.

Another embodiment of such a filter consists in achieving the subtraction operation obtained in the above example with $A_1$ and $A_2$, in the CCD itself. In fact a CCD operates by weighting on a set of n successive samples of the signal to be filtered s(t) to s(t−(n−1)T) by multiplying the value of these samples by a set of n weights $a_1$ to $a_n$ calculated in accordance with the known techniques of the synthesis of digital filters.

Thus signal $S_1$ (t) is given by:

$$S_1(t) = a_1 \cdot s(t) + a_2 \cdot s(t-T)/ + \ldots + a_{n-1} \cdot s(t-(n-2)T) + a_n \cdot s(t-(n-1)T).$$

Signal $S_1$ (t−T) is given by:
$$S_1(t-T) = a_1 \cdot s(t-T) + a_2 \cdot s(t-2T)/ + \ldots + a_{n-1} \cdot s(t-(n-1)T) + a_n \cdot s(t-nT).$$

The difference signal is given by:
ti $S_1(t) - S_1(t-T) = a_1 \cdot s(t) + (a_2-a_1) \cdot s(t-T) + (a_3-a_2) \cdot s(t-2T) + \ldots + (a_n - a_{n-1}) \cdot s(t-(n-1)T) - a_n \cdot s(t-nT).$ It can be seen that the assembly composed of the CCD contained in box 101 and amplifiers $A_1$ and $A_2$ may be replaced with their subsidiary members by another CCD comprising an additional cell and characterized by an assembly of n+1 weights defined by: $a_1$, $a_2-a_1$, $a_3-a_2$, ..., $a_n-a_{n-1}$, $-a_n$. This CCD will therefore have one more weighting cell than that of the CCD used in the circuit of FIG. 1 in the amount of material, this single cell will replace the two amplifiers $A_1$ and $A_2$ and their subsidiary members. The integrator, formed by amplifier $A_3$ and its subsidiary members, will remain nevertheless necessary.

The choice between these two embodiments will depend on the difficulties of construction of the CCDs. In fact it is known that one of the difficulties met in the construction of these devices is the accuracy required in the weighting cells. The greater the range of weightings, the more difficult it is to obtain accuracy for the low weightings. This range is different in the two embodiments since the weighting assemblies are different. These weightings themselves depend on the filtering patterns to be obtained and the choice is thus a specific case according to the desired pattern.

It is apparent that within the scope of the invention, modifications and different arrangements can be made other than is here disclosed. The present disclosure is merely illustrative with the invention comprehending all variations thereof.

What is claimed is:

1. In an analog sampling filter for filtering a stair-case signal from a charge-coupled device, the improvement comprising:
    a first order analog interpolating means for filtering said stair-case signal;
    a plurality of clocking means for dividing each step of said stair-case signals into segments for controlling the output of said charge-coupled device in coordination with the switching of said interpolation means to provide an output signal corresponding to said stair-case signals whose out-of band signals have been minimized.

2. The improved sampling filter of claim 1 wherein said first order interpolation comprises:
    a storage means for storing a first step of said stair-case signal;
    substraction means for substracting said first step from a second step of said stair-case signal and outputting a subtracted signal; and
    integrating means for integrating said subtracted signal.

3. In an analog sampling filter for filtering a stair-case signal from a charge-coupled device to provide a first set of n weighting coefficients $a_1$, $a_2$, ... $a_n$, the improvement comprising:
    said charge-coupled device having n+1 cells weighted in accordance with a second set of n+1 weighting coefficients $a_1$, $a_2-a_1$, $a_3-a_2$, ... $a_n - a_{n-1}$, $-a_n$;
    integrating means for integrating the signal delivered by said charge-coupled device.

* * * * *